United States Patent [19]
Otani

[11] Patent Number: 6,040,594
[45] Date of Patent: Mar. 21, 2000

[54] HIGH PERMITTIVITY ST THIN FILM AND A CAPACITOR FOR A SEMICONDUCTOR INTEGRATED CIRCUIT HAVING SUCH A THIN FILM

[75] Inventor: Seigen Otani, Kawasaki, Japan

[73] Assignee: Fujitsu Limited, Kawasaki, Japan

[21] Appl. No.: 09/205,398

[22] Filed: Dec. 4, 1998

Related U.S. Application Data

[62] Division of application No. 08/429,169, Apr. 26, 1995, Pat. No. 5,882,946.

[30] Foreign Application Priority Data

Jul. 27, 1994 [JP] Japan ................................ 6-175549

[51] Int. Cl.$^7$ .......................... H01L 29/76; H01L 29/94; H01L 31/062; H01L 31/113; H01L 31/119
[52] U.S. Cl. ...................... 257/295; 257/310; 438/240
[58] Field of Search .................... 257/295, 310; 438/240

[56] References Cited

U.S. PATENT DOCUMENTS

| 5,005,102 | 4/1991 | Larson . |
| 5,142,437 | 8/1992 | Kammerdiner et al. . |
| 5,216,572 | 6/1993 | Larson et al. . |
| 5,218,512 | 6/1993 | Nakamura ............................... 361/321 |
| 5,332,684 | 7/1994 | Yamamichi et al. .................... 438/240 |
| 5,781,404 | 7/1998 | Summerfelt et al. ................. 361/321.5 |

OTHER PUBLICATIONS

Yabuta et al., "Improved Electrical Properties of SrTiO3 Thin Films by Electron Cyclotron resonance Plasma Chemical Vapor Deposition", Mat. Res. Soc. Symp. Proc., vol. 361, pp. 325–330, Jan. 1995.

Sakuma et al., "Barrier layers for realization of high capacitance density in SrTiO3 thin–film capacitor on silicon", Appl. Phys. Lett., 57(23), pp. 2431–2433, Dec. 1990.

Technical Report of IEICE, ED–93–165, NW93–122, P–55, Abstract, The Institute of Electronics Information and Communication Engineers, "Application of SrTiO$_3$ thin film capacitor of CaAs–ICs by using the low–temperature RF sputtering method", M. Nishitsuji et al., Jan. 1994, Japan.

*Primary Examiner*—Olik Chaudhuri
*Assistant Examiner*—Howard Weiss
*Attorney, Agent, or Firm*—Armstrong, Westerman, Hattori, McLeland & Naughton

[57] ABSTRACT

A semiconductor integrated circuit integrating a high-permittivity thin film capacitor of strontium titanate on the same semiconductor chip, the thin film capacitor consisting of a pair of electrodes and essentially crystalline strontium titanate film therebetween which has a thin surface layer where concentration of titanium is higher than that of the rest of the crystalline strontium titanate film. In one embodiment according to the present invention, a thin film capacitor was fabricated by depositing a 200 nm thick film of strontium titanate at a temperature of 300° C. on a 10 nm thick amorphous titanium oxide film which eventually became the thin surface layer, and subsequent annealing of 250° C. for 30 min in an oxidation atmosphere. A structure and processes realized a thin film capacitor having a dielectric constant of 100 and leakage current density of $4 \times 10^{-7}$ A/cm$^2$ without degrading characteristics of transistors already fabricated in the same semiconductor chip.

6 Claims, 5 Drawing Sheets

HIGH PERMITTIVITY ST THIN FILM AND A CAPACITOR FOR A SEMICONDUCTOR INTEGRATED CIRCUIT HAVING SUCH A THIN FILM

This application is a division of prior application Ser. No. 08/429,169 filed Apr. 26, 1995 now U.S. Pat. No. 5,882,946.

FIELD OF INVENTION

The present invention relates to a high-permittivity thin film capacitor, and more particularly to a high-permittivity thin film capacitor for a semiconductor integrated circuit and a fabrication method thereof.

DESCRIPTION OF THE PRIOR ART

Recently, a capacitor being a smaller in size and larger in an electrostatic capacity has been requested for a high-packing density and high-speed integrated semiconductor circuit, such as a GaAs-IC for a portable telephone and a silicon LSI chip for a dynamic random access memory. For these purposes, crystalline strontium titanate ($SrTiO_3$) has been particularly paid an attention to because of its dielectric properties such as high permittivity and a low dielectric loss in a high-frequency range. However, a high quality crystalline strontium titanate needs a thermal treatment of higher than 400° C., which is high enough to destroy a microwave monolithic GaAs-IC if a thin film capacitor of crystalline strontium titanate is integrated on the same chip. That simply can not lead to the thermal treatment at a lower temperature because it generally results in degrading crystallinity and increasing leakage current density. For the above reason, a thin film capacitor of crystalline strontium titanate has been mounted on a multichip module discretely from a semiconductor chip in commercial products. An attempt to integrate a thin film capacitor of strontium titanate on a semiconductor chip has recently been done. However, leakage current density is not yet small enough for commercial use.

SUMMARY OF INVENTION

It is an object according to a first aspect of the present invention to provide a thin film of crystalline strontium titanate having high-permittivity, and low leakage characteristics for a capacitor of small size and high electrostatic capacity.

It is an object according to a second aspect of the present invention to provide a semiconductor device comprising a semiconductor integrated circuit and a thin film capacitor of crystalline strontium titanate on the same semiconductor chip.

It is an object according to a third aspect of the present invention to provide a method of fabricating a thin film capacitor of crystalline strontium titanate compatible to a semiconductor integrated circuit.

A representative one of the present invention disclosed hereinafter will be summarized simply hereunder, which is not necessarily limitative.

A high-permittivity thin film essentially consisting of strontium titanate ($SrTiO_3$) comprising a surface layer where concentration of titanium atoms is higher than that in the rest of the high-permittivity thin film. The film can be obtained by a method comprising steps of depositing an amorphous layer of titanium oxide $TiO_x$ (0<X<2) on a conducting layer, and subsequently depositing a layer essentially consisting of strontium titanate ($SrTiO_3$) on the amorphous layer of titanium oxide. Further, depositing another conducting layer on the layer essentially consisting of strontium titanate ($SrTiO_3$), annealing the deposited layers in an oxidation atmosphere, and patterning them provides a high-permittivity thin film capacitor according to the present invention.

BRIEF DESCRIPTION OF DRAWINGS

The present invention will be more apparent from the following description, when taken to conjunction with the accompanying drawings, in which.

DESCRIPTION OF THE PREFERRED EMBODIMENTS

Figure 1:
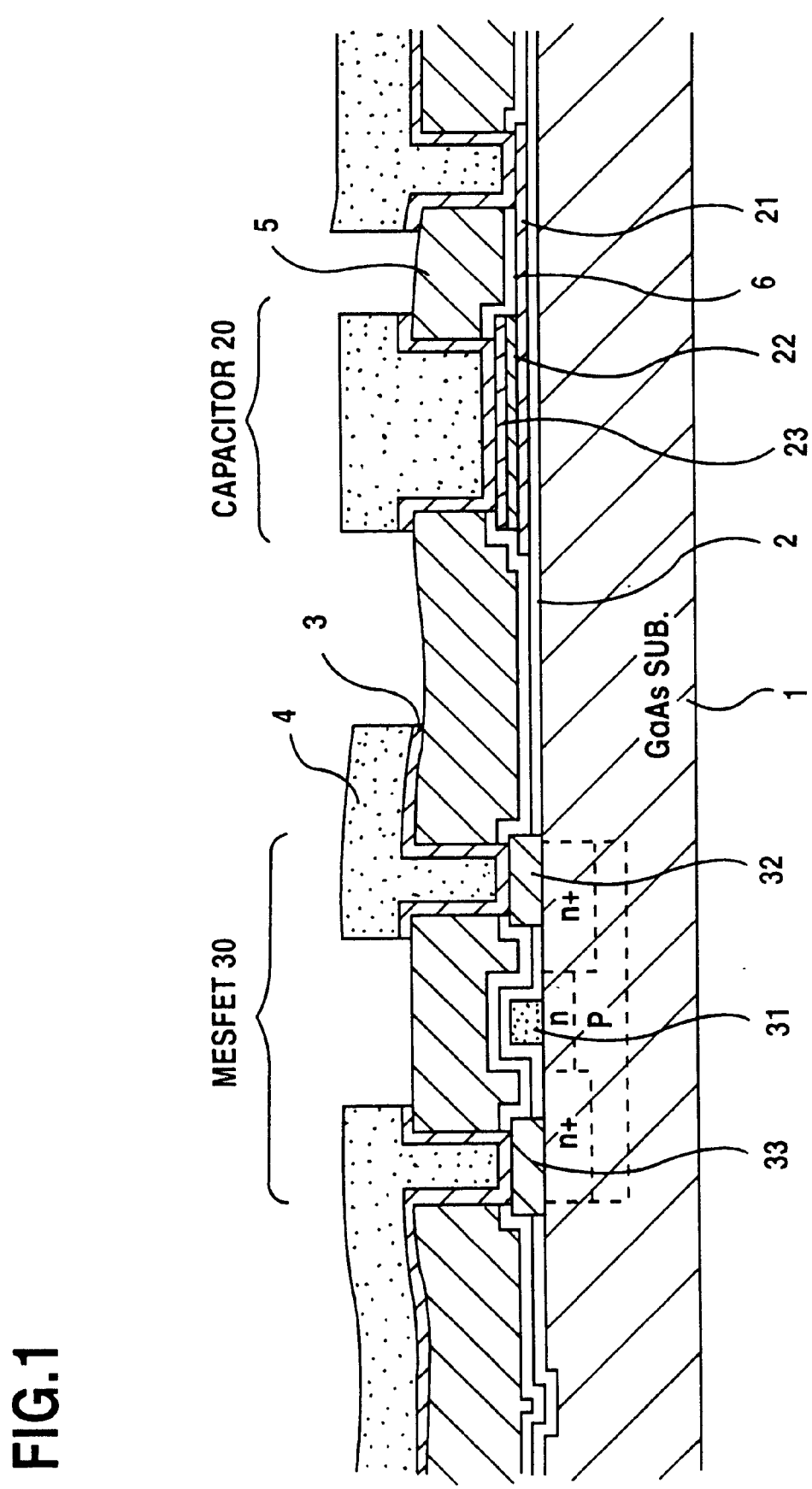
FIG. 1 is a cross-sectional view of a monolithic GaAs-IC having a thin film capacitor of strontium titanate ($SrTiO_3$) according to the present invention.

FIG. 1 shows a cross-sectional view of monolithic GaAs-IC having a thin film capacitor of strontium titanate ($SrTiO_3$) according to the present invention. A self-aligned gate GaAs-MESFET 30 having refractory metal electrodes for gate 31, source 32, and drain 33 is formed in a GaAs substrate 1, and a thin film capacitor 20 composed of a lower electrode 21, an upper electrode 23, and a high-permittivity thin film of essentially consisting of crystalline strontium titanate 22 between the pair of electrodes is formed on the first insulating layer 2 passivating the surface of the GaAs substrate 1. The GaAs-MESFET 30 and the thin film capacitor 20 are separated by a field insulating layer 5 underlaid by the second insulating layer 6 protecting the side wall of the high-permittivity thin film of essentially consisting of crystalline strontium titanate 22, and connected to an interconnection layer 4 underlaid by a barrier metal layer 3.

Main steps of fabricating the above semiconductor integrated circuit are as follows; After the GaAs-MESFET 30 was fabricated by a conventional method, a 100 nm thick laminated metal layer of platinum and titanium for the lower electrode 21 were successively deposited on the first insulating layer 2 of silicon nitride by sputtering method.

After patterning and etching the metal layer 21, a 10~50 nm thick amorphous titanium oxide layer $TiO_x$ (0<X<2) was deposited by DC reactive sputtering method at a temperature below 200° C. When the temperature is above 200° C., the amorphous titanium oxide layer $TiO_x$ is transformed into anatase titanium dioxide ($TiO_2$) which would considerably degrade permittivity and leakage current density of a thin film composed of $TiO_2+SrTiO_3$. The amorphous titanium oxide layer $TiO_x$ was confirmed by X-ray diffraction analysis. Subsequently, a thin film of $SrTiO_3$ was deposited on the amorphous titanium oxide layer $TiO_x$ by RF magnetron sputtering method. A sputtering target was a sintered $SrTiO_3$ powder. Sputtering condition was as follows; RF power density of 1 W/cm², a gas flow rate (Ar/O₂) of 10, a total pressure of 1.2 Pa., a substrate temperature of 300° C., and a deposition thickness of 100~500 nm thick. The thermal effect during growth of the thin film $SrTiO_3$ and a subsequent annealing in an oxidation atmosphere at a temperature below 300° C., preferably below 270° C. gave rise to diffusion of strontium atoms into the amorphous titanium layer $TiO_x$ resultantly to transform the amorphous titanium layer $TiO_x$ into a non-stoichiometric crystalline strontium titanate layer $Sr_{1-x}Ti_xO_3$ (0<X<1). As a whole, a high-permittivity thin film 22 having a low leakage characteristics was obtained. A 100 nm thick platinum layer was deposited on the high-permittivity thin film 22 to form the upper electrode 23 by DC sputtering. Further, a 200 nm thick silicon nitride layer was deposited for a protective layer by plasma CVD at temperature of 300° C. Finally, a titanium-tungsten layer 3 and a gold layer 4 were successively deposited to form the interconnection layer.

Figure 2:
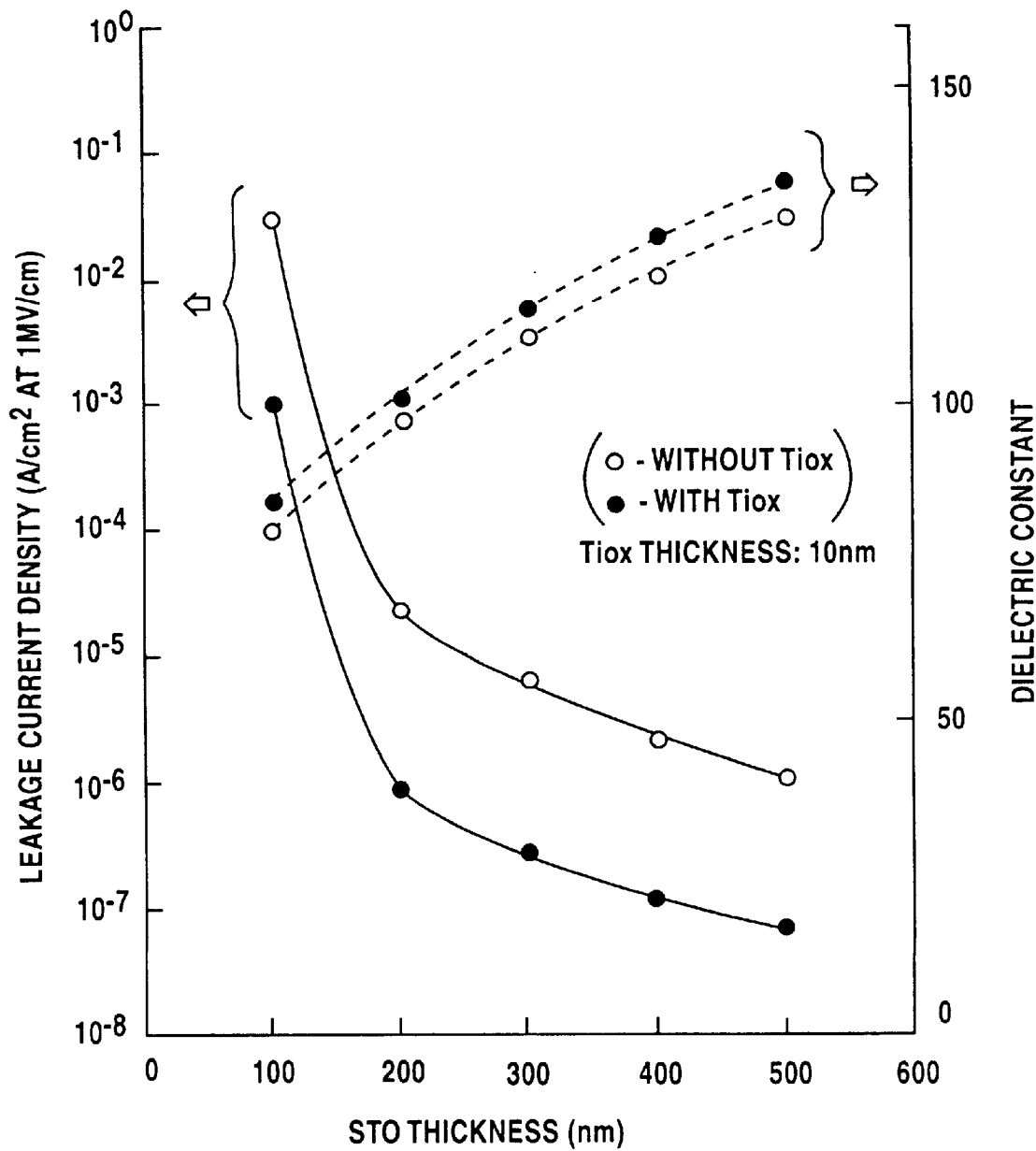
FIG. 2 is a diagram illustrating dependence of dielectric constant and leakage current density upon thickness of a thin film of strontium titanate (STO) according to the present invention.

FIG. 2 is a diagram illustrating dependence of dielectric constant and leakage current density upon thickness of a thin film of strontium titanate (abbreviated by STO )according to the present invention. It shows that the thin film of strontium titanate deposited on the amorphous titanium oxide film has lower leakage current density and higher dielectric constant throughout the whole thickness measured compared with that deposited directly on a metal surface of an electrode. In the diagram, a solid dot ● and an open dot ○ indicate measured points for each of samples with and without the amorphous titanium oxide film, respectively. For example, a 200 nm thick film of strontium titanate ($SrTiO_3$) with a 10 nm thick amorphous titanium oxide film ($TiO_x$) has a leakage current density of $9.0 \times 10^{-7}$ A/cm² while a 200 nm thick film of strontium titanate without an amorphous titanium oxide film has a leakage current density of $2.5 \times 10^{-5}$ A/cm², which improves the leakage current density by as much as a factor.

Figure 3:
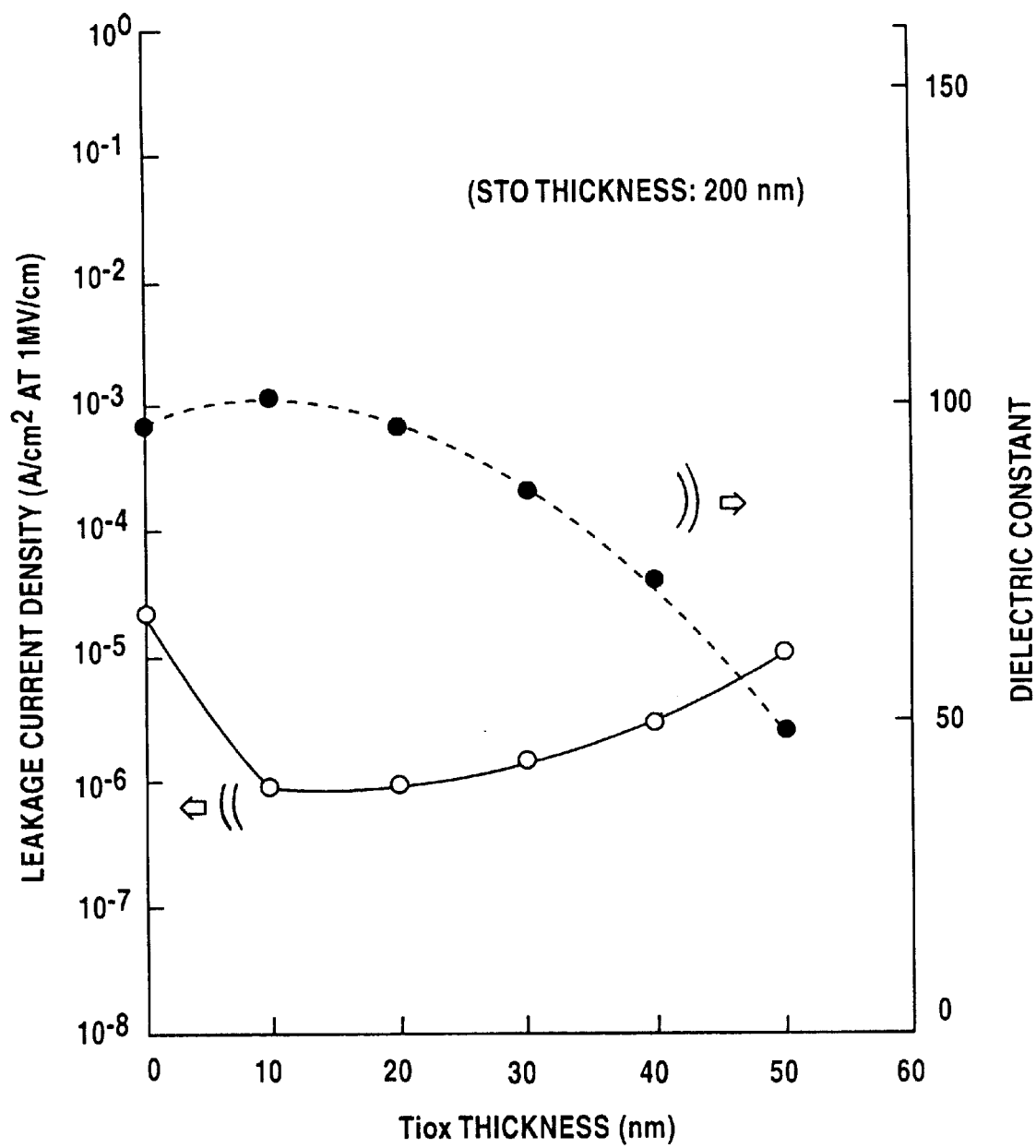
FIG. 3 is a diagram illustrating dependence of dielectric constant and leakage current density upon thickness of an amorphous titanium oxide ($TiO_x$) on which subsequently a thin film of strontium titanate is deposited according to the present invention.

FIG. 3 is a diagram illustrating dependence of dielectric constant indicated by a solid dot ● and leakage current density indicated by an open dot ○ upon thickness of an amorphous titanium oxide ($TiO_x$) on which a thin film of strontium titanate is deposited according to the present invention. It clearly shows that the leakage current density has a minimum point between 10 nm and 30 nm thick. In a typical case, when a 200 nm thick film of strontium titanate was deposited on a 10 nm thick amorphous titanium oxide film, a dielectric constant of 100 and leakage current density of $9 \times 10^{-7}$ A/cm² were obtained. A subsequent annealing of 250° C. for 30 min in an oxidation atmosphere further decreased the leakage current density down to $4 \times 10^{-7}$ A/cm².

These and other related experiments revealed that the amorphous titanium oxide film should be thinner than 30 nm thick, preferably thinner than 15 nm thick, and further if the amorphous titanium oxide film is thicker than 10 nm thick, the film of strontium titanate should be thicker than 100 nm thick, preferably thicker than 200 nm thick. The optimum deposition temperature of the amorphous titanium oxide film ($TiO_x$) is lower than 220° C., preferably lower than 200° C., while the optimum deposition temperature of the strontium titanate film ($SrTiO_3$) is between 250° C. and 350° C., preferably between 280 DC and 320° C., and the subsequent annealing in an oxidation atmosphere should be carried out lower than 300° C., preferably lower than 270° C.

Since it is supposed that the thin amorphous titanium oxide film ($TiO_x$) acts as a seed for homogeneous nucleation of a high-quality crystalline strontium titanate film, the thin amorphous strontium titanium oxide film, which may be written by $Sr_{1-x}Ti_xO_y$ (0<X<1, 0<Y<3), is expected to have the same effect on the strontium titanate film ($SrTiO_3$) to improve leakage characteristics and dielectric constant just as the thin amorphous titanium oxide film has, which also has an advantage in the sputtering process of depositing the strontium titanate film that there is no need to exchange a target of sputtering.

Although strontium titanate $SrTiO_3$ is paraelectric at a room temperature, it is transformed into ferroelectric by substituting barium atoms for strontium atoms which can be used for a non-volatile memory. Further, considerable improvement in various physical properties such as temperature dependence of dielectric characteristics, moisture resistance, or thermal expansion coefficient as well as dielectric constant itself are generally expected by doping various elements such as other alkaline-earth metals, elements belonging to titanium group and tin group, rare earth metals, or transition metals to the strontium titanate film.

Figure 4:
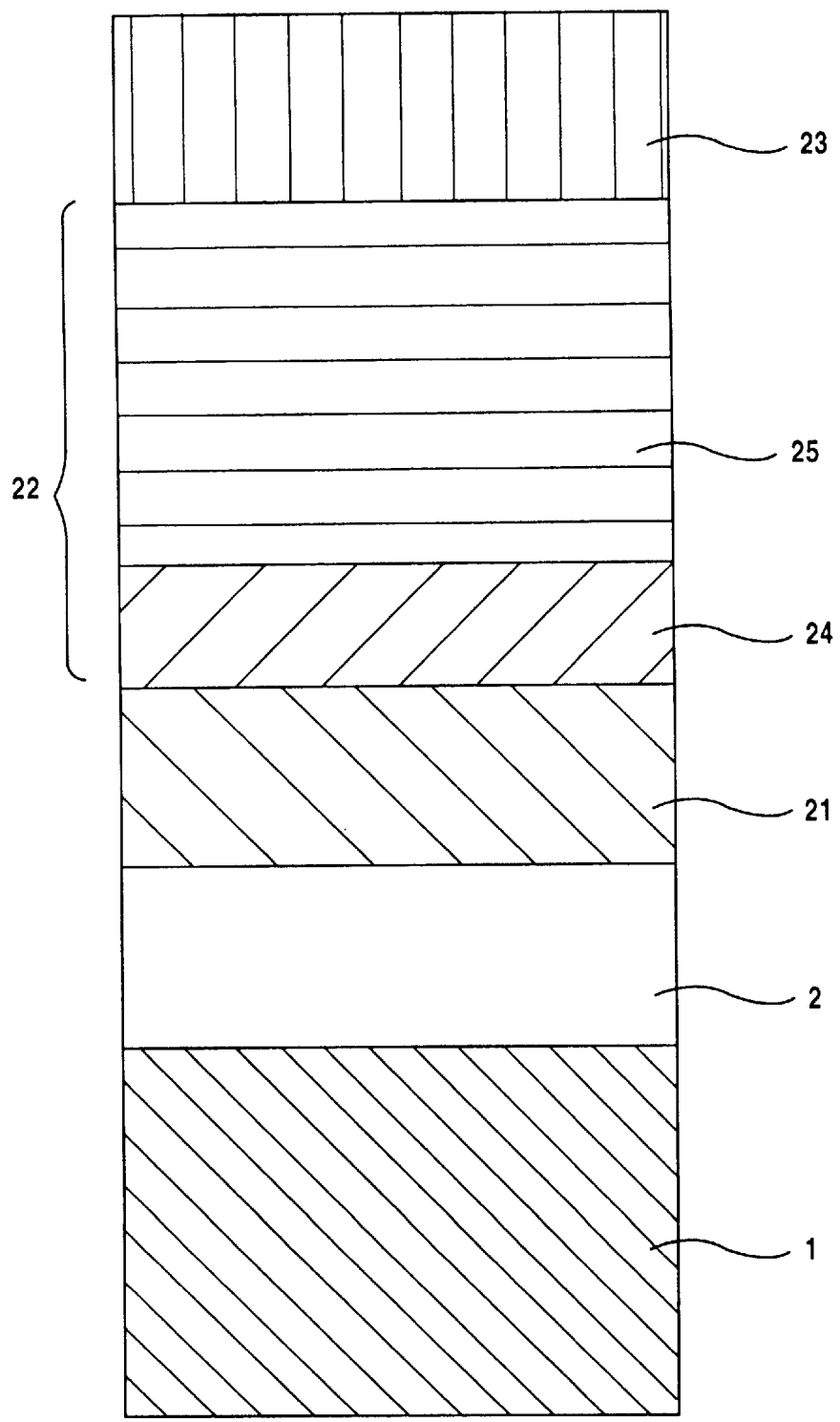
FIG. 4 is a cross-sectional view of a thin film capacitor of strontium titanate ($SrTiO_3$) integrated on a semiconductor substrate according to the present invention.

FIG. 4 is a cross-sectional view of a thin film capacitor of strontium titanate ($SrTiO_3$) 20 integrated on a semiconductor substrate according to the present invention. The dielectric film 22 consists of a strontium titanate ($SrTiO_3$) 25 and a surface layer 24 composed of the non-stoichiometric crystalline strontium titanate layer $Sr_{1-x}Ti_xO_3$ (0<X<1). It was observed by SIMS analysis that there was the surface layer 24 where indeed a concentration of titanium atoms was higher than that of strontium atoms.

Figure 5:
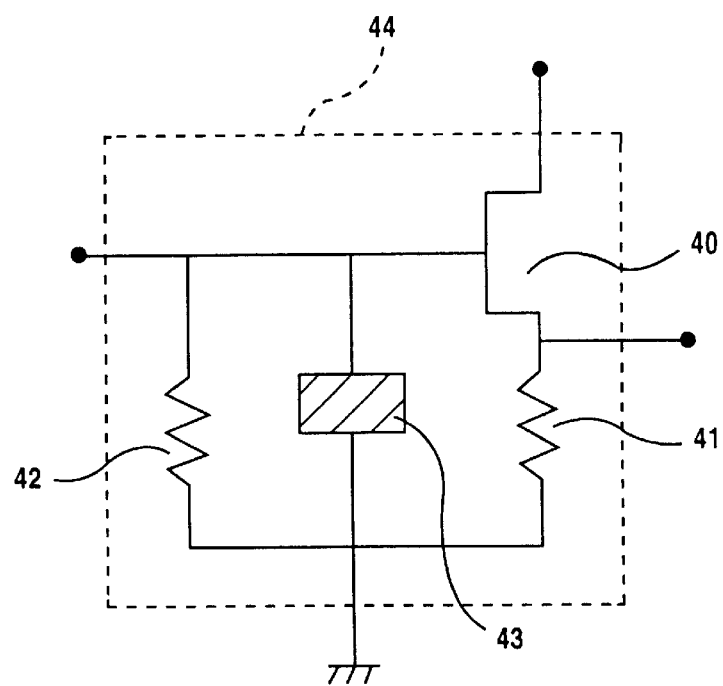
FIG. 5 is a circuit diagram of a GaAs MESFET-IC integrating a thin film capacitor of strontium titanate thereon for a portable telephone according to the present invention.

FIG. 5 is a circuit diagram of a GaAs MESFET-IC integrating a thin film capacitor of strontium titanate thereon for a portable telephone according to the present invention, where an integrated circuit 44 consists a GaAs MESFET 40, a load resistance 41, an input resistance 42, and a bypass condenser 43 which is a thin film capacitor.

Figure 6:
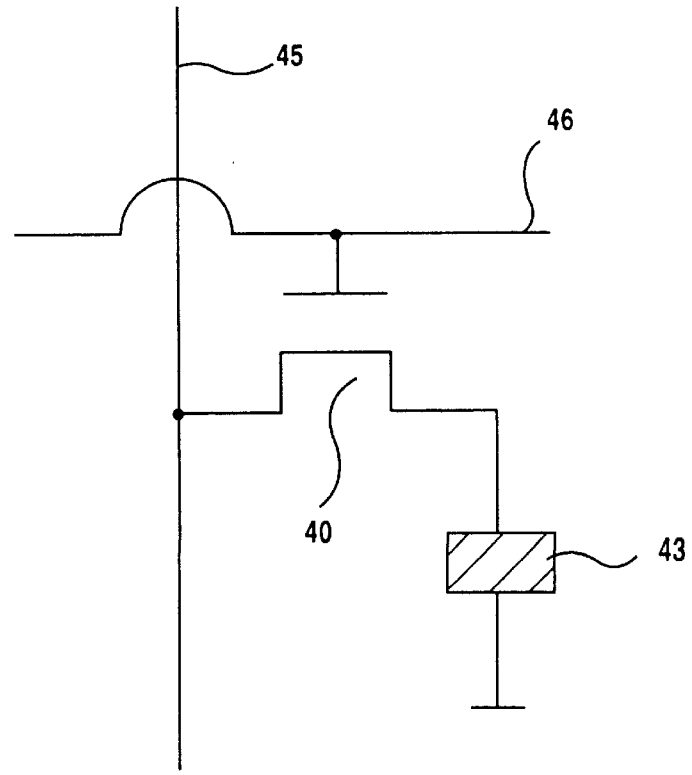
FIG. 6 is a circuit diagram of a memory cell in a silicon MOSIC integrating a thin film capacitor of strontium titanate thereon for a dynamic random access memory according to the present invention.

FIG. 6 is a circuit diagram of a memory cell in a silicon MOSIC integrating a thin film capacitor of strontium titanate thereon for a dynamic random access memory (DRAM) according to the present invention, where the memory cell for DRAM consists of a Si MOSFET 40 for a transfer gate and a thin film capacitor of strontium titanate 43 for a storage capacitor with a bit line 45 and a word line 46. Since a typical dielectric constant of strontium titanate for one embodiment according to the present invention is 100 which is larger almost by a factor than that of silicon dioxide used for the conventional memory cell, therefor, a capacitor area is expected to shrink by a factor that can realize a higher packing density DRAM chip.

It is claimed:

1. A high-permittivity thin film essentially consisting of strontium titanate ($SrTiO_3$) comprising a surface layer where concentration of titanium atoms is higher than that in a rest of the high-permittivity thin film.

2. The high-permittivity thin film according to claim 1, wherein at a room temperature, relative permittivity of the high-permittivity thin film is higher than 100 and a leakage current is less than $1\times10^{-6}$ A/cm$^2$.

3. The high-permittivity thin film according to claim 1, wherein the surface layer is thinner than 30 nm thick.

4. The high-permittivity thin film according to claim 1, wherein the high-permittivity thin film is thicker than 100 nm thick, when the surface layer is thicker than 10 nm thick.

5. A semiconductor device comprising:

a semiconductor substrate where a semiconductor integrated circuit is formed;

a capacitor formed on an insulated surface of the semiconductor substrate, the capacitor consisting of a pair of electrodes and a high-permittivity thin film between the electrodes, wherein the high-permittivity thin film essentially consists of strontium titanate (SrTiO$_3$) having a surface layer where concentration of titanium atoms is higher than that in a rest of the high-permittivity thin film; and an interconnection layer which operatively connects between one of the electrodes and the semiconductor integrated circuit.

6. The semiconductor device according to claim 5, wherein one of the electrodes is a laminating layer comprising of a platinum layer formed on a titanium layer which is formed on the insulated surface of the semiconductor substrate, the platinum layer adheres to the surface layer of the high-permittivity thin film, and another of the electrodes is a patterned layer of titanium nitride or titanium tungsten formed on the opposite surface of the high-permittivity thin film.

* * * * *